United States Patent [19]

Takaishi et al.

[11] Patent Number: 5,670,894
[45] Date of Patent: Sep. 23, 1997

[54] SEMICONDUCTOR DEVICE HAVING OUTPUT SIGNAL CONTROL CIRCUIT

[75] Inventors: Toru Takaishi; Tetsu Tanizawa, both of Kawasaki, Japan

[73] Assignee: Fujitsu Limited, Kawasaki, Japan

[21] Appl. No.: 754,029

[22] Filed: Dec. 4, 1996

Related U.S. Application Data

[63] Continuation of Ser. No. 450,173, May 25, 1995, abandoned.

[30] Foreign Application Priority Data

Jul. 28, 1994 [JP] Japan .................. 6-176715

[51] Int. Cl.⁶ .................. H03K 19/0948; H03K 19/017; H03K 17/16
[52] U.S. Cl. .................. 326/27; 326/17; 326/34; 326/86; 327/170
[58] Field of Search .................. 326/83, 86, 27, 326/30, 112, 119, 121, 31–32, 34, 17; 327/170, 376–377, 389

[56] References Cited

U.S. PATENT DOCUMENTS

| | | | |
|---|---|---|---|
| 4,739,193 | 4/1988 | Doty, II | 326/30 |
| 4,779,013 | 10/1988 | Tanaka | 326/27 |
| 4,785,203 | 11/1988 | Nakamura | 326/121 |
| 4,894,560 | 1/1990 | Chung | 327/170 |
| 5,070,256 | 12/1991 | Grondalski | 327/170 |
| 5,497,113 | 3/1996 | Uber | 327/170 |

*Primary Examiner*—Edward P. Westin
*Assistant Examiner*—Jon Santamauro
*Attorney, Agent, or Firm*—Nikaido, Marmelstein, Murray & Oram LLP

[57] ABSTRACT

The present invention is to provide an output circuit, for a semiconductor circuit, capable of increasing the rise or fall time of an output signal without reducing the operating frequency of the output circuit, and thus effectively preventing occurrence of a malfunction due to an undesired change in the output signal caused by ringing, noise, or reflection occurring at the transition of the output signal. In the structure of present invention, an output circuit for a semiconductor circuit includes an input circuit, an output circuit including a transistor, and a control signal control circuit that lies between the input circuit and output circuit, outputs a control signal for use in driving the transistor in the output circuit, and changes the control signal according to a function of time.

6 Claims, 20 Drawing Sheets

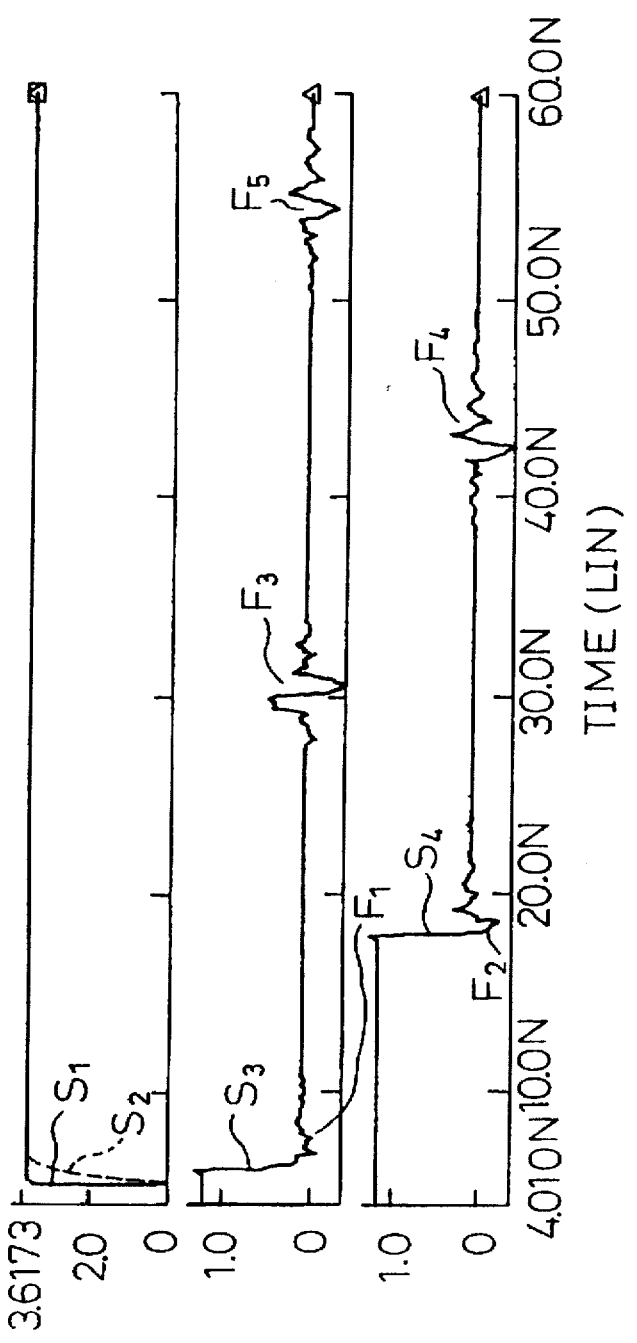

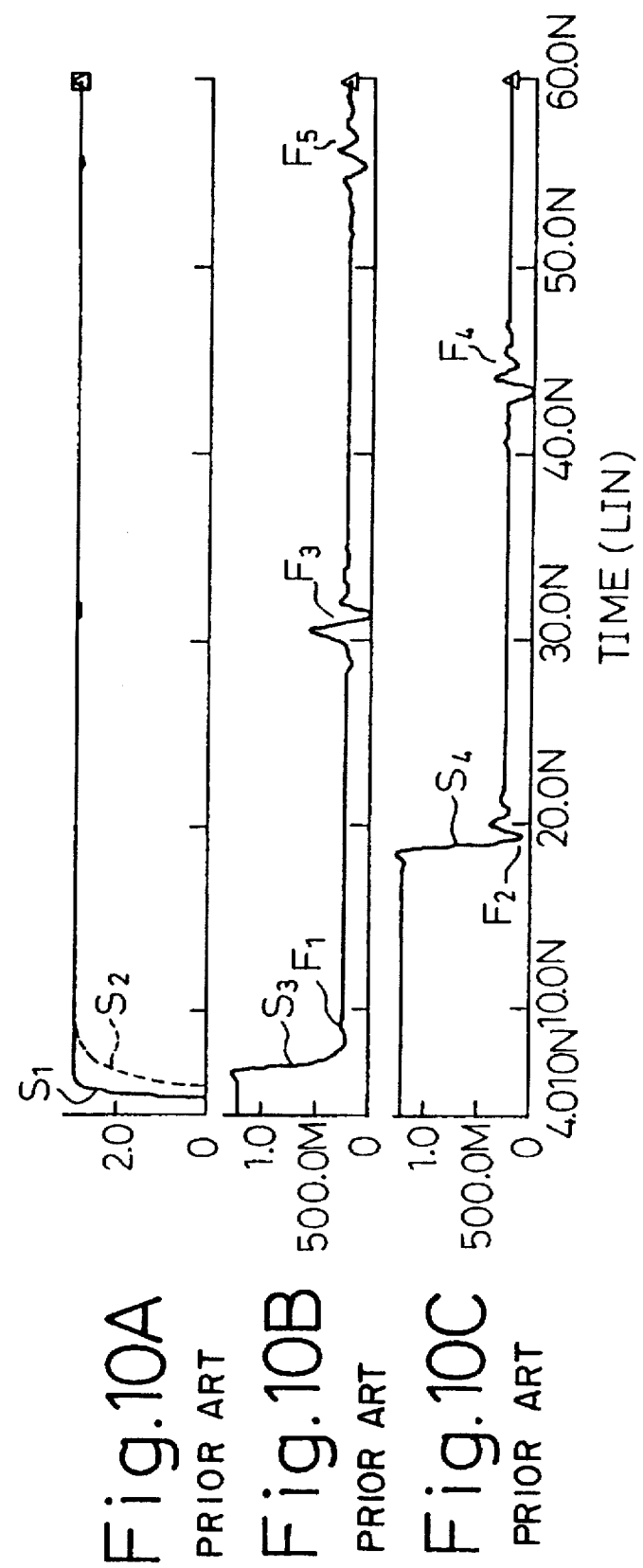

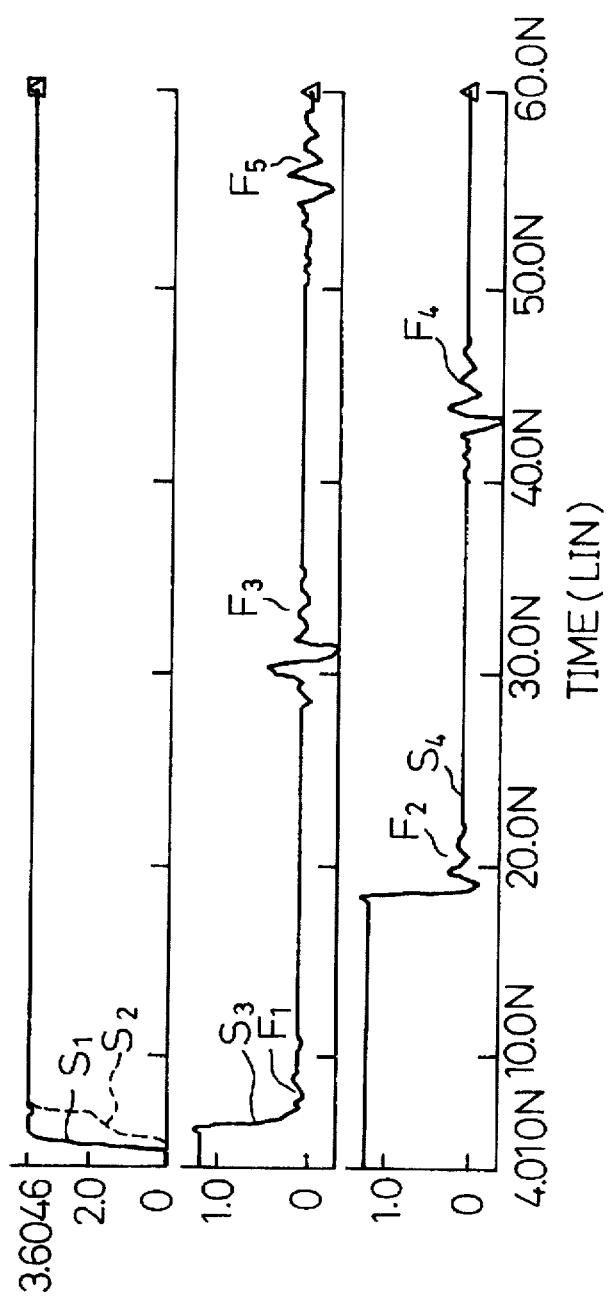

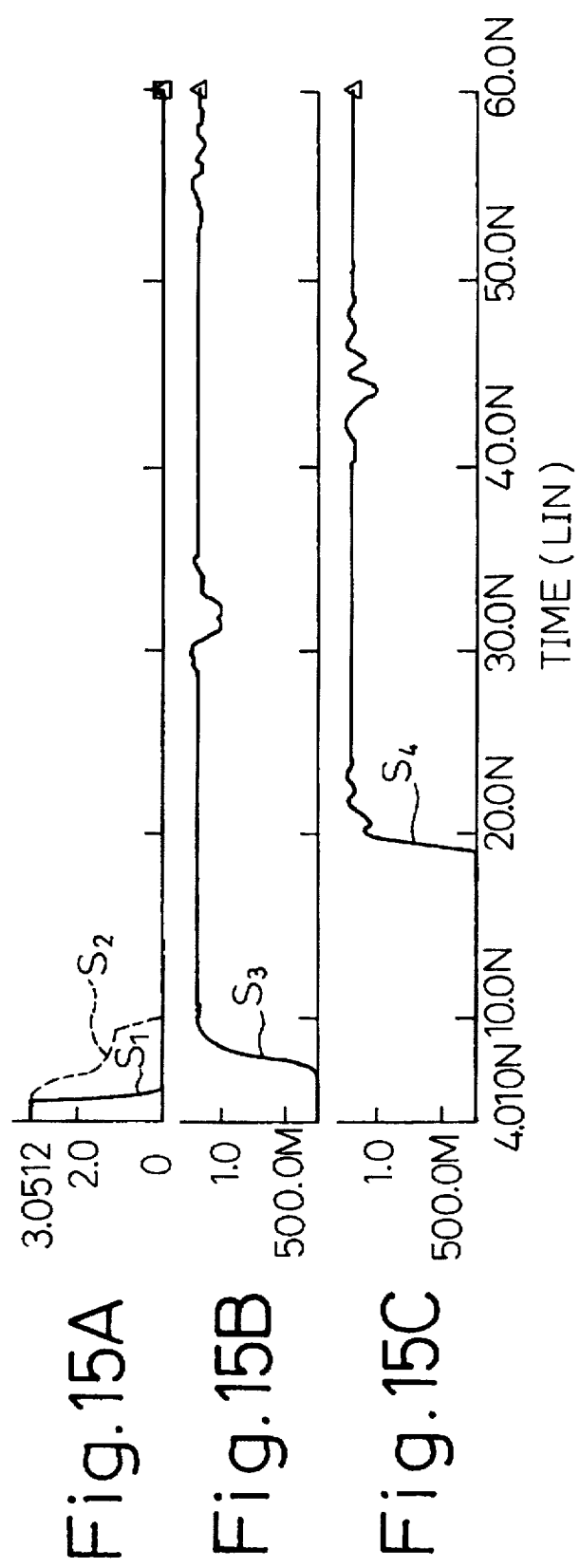

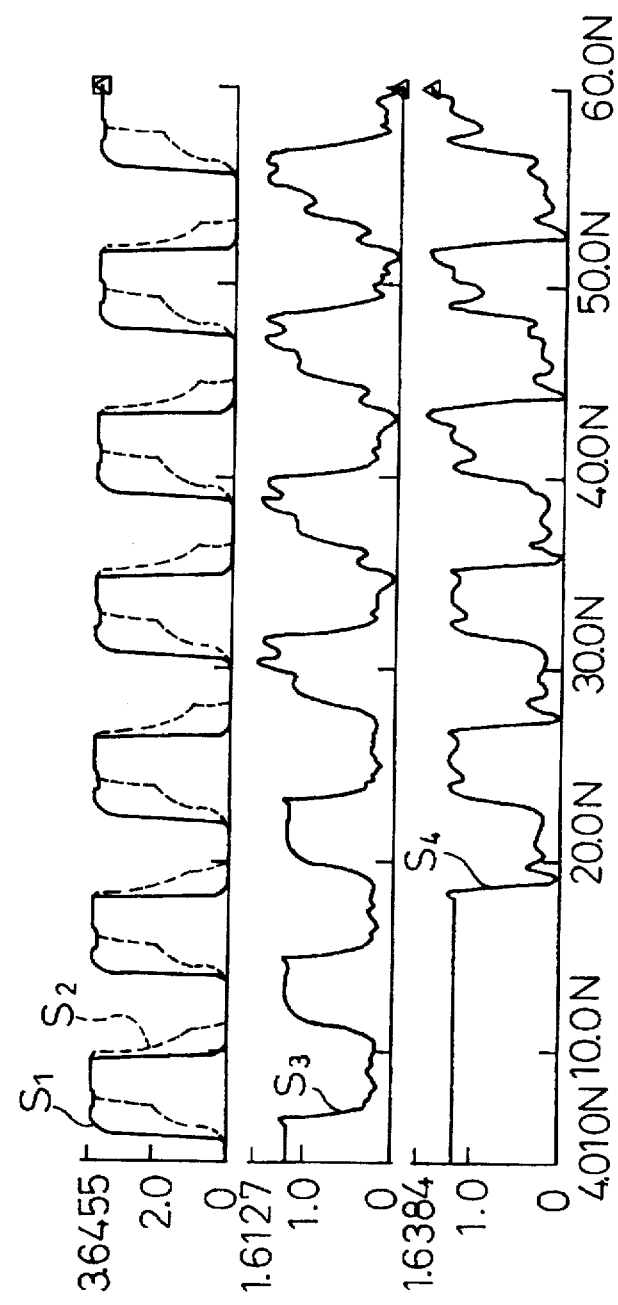

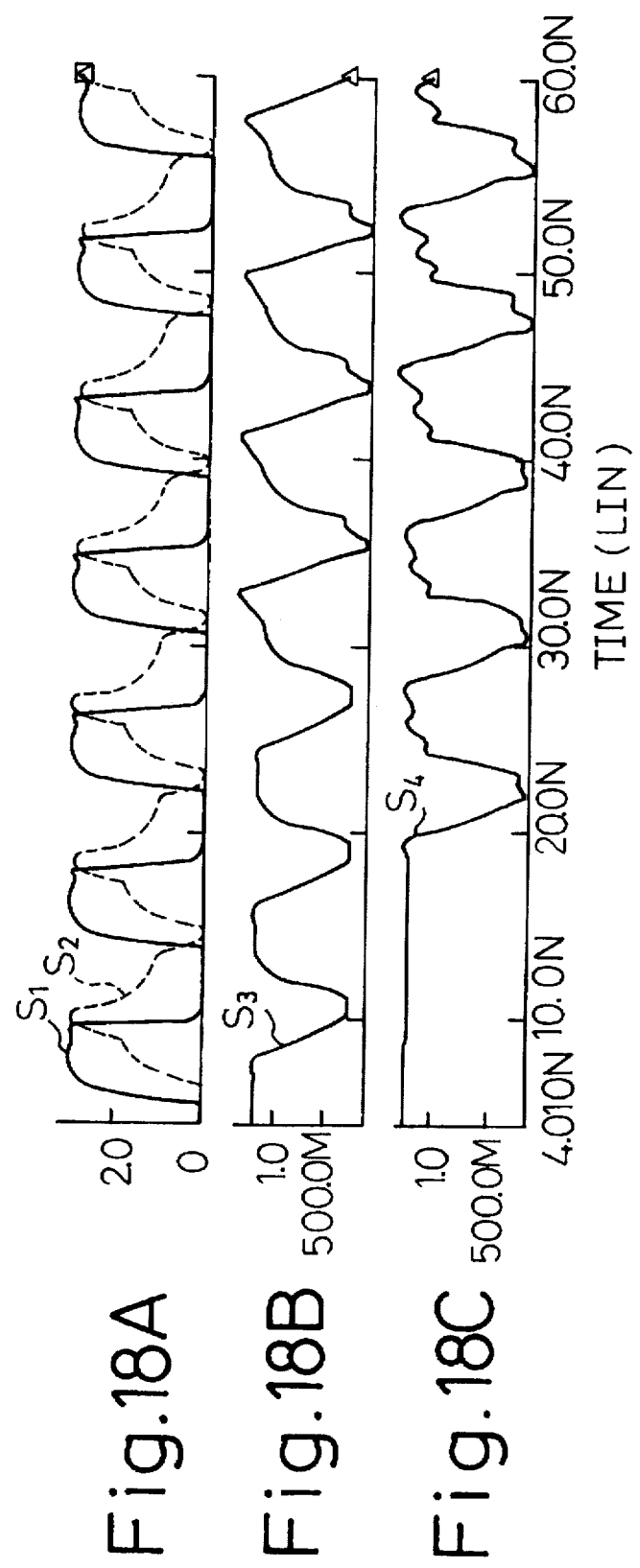

SEMICONDUCTOR DEVICE HAVING OUTPUT SIGNAL CONTROL CIRCUIT

This application is a continuation of U.S. application Ser. No. 08/450,173 filed May 25, 1995, now abandoned.

BACKGROUND OF THE INVENTION

1. Field of the Invention

The present invention relates to a semiconductor circuit and, more particularly, to the circuitry of a small-amplitude interface output circuit in a semiconductor integrated circuit.

2. Description of the Related Art

In the past, information or data fed to a semiconductor circuit whose major component is a semiconductor integrated circuit has been degraded due to noise or reflections occurring at the time of input or output of a signal or during the transmission or reception of data. In an effort to avoid this problem, the transition of an output is dulled by uniformly dulling the transitions of gate inputs of output transistors, thus suppressing signal degradation resulting from noise or reflections.

FIG. 4 is a block diagram dulling an example of elements of a conventional output circuit employed in general. The output circuit comprises an input means 1, a drive means 3 including two stages of inverters, and an output means 4.

FIGS. 5A and 5B are graphs schematically showing waveforms of an output N1 of the first-stage inverter INV1, an output N2 of the second-stage inverter INV2, and an output of the output means 4, which respond to an input signal IN fed to the input means. In FIG. 5A, the input signal of the input means makes a low-to-high transition. In FIG. 5B, the input signal of the input means makes a high-to-low transition.

Conventionally, in order to avoid the aforesaid problem, a method of uniformly dulling the transitions of internal signals, whose amplitudes are large, so as to dull the transition of an output, whose amplitude is small and which fluctuates at short intervals, has been adopted.

To be more specific, as shown in FIG. 5A, when an input signal of an input means makes a low-to-high transition, the transition of an output signal is dulled by, for example, changing a size of the transistor of a p-channel transistor PM2 and a size of an n-channel transistor NM2 constituting the second-stage invertor NM2. Thus, the output N2 of the second-stage inverter INV2 is changed from waveform 01 to waveform 02 as shown in FIG. 4.

However, when the output N2 of the inverter INV2 is changed uniformly from waveform 01 to waveform 02, until the gate signal of an n-channel transistor NM3 forming the output means 4 reaches the threshold voltage of the transistor NM3, an output signal does not change at all. The dull of the gate signal waveform leads merely to an output delay. This is not effective in reducing the coefficient of variation of the output signal.

A dull in the gate voltage wave after an output signal stops changing, is also regardless of a dull formed in the output signal.

The same applies to the case shown in FIG. 5B in which an input signal fed to an input means makes a high-to-low transition.

That is to say, when the transitions of gate signals are dulled uniformly, the overall delay increases. However, the transition of an output signal is hardly affected. Moreover, since the gate signals that have made dull transitions must be stepped up or down fully, the operating frequency cannot be made higher.

FIG. 6 shows an example of the circuitry of a simulator for verifying how a signal distortion, due to influence of noise or reflection, occurs and changes when the conventional output circuit for a semiconductor circuit is used to transmit a data signal.

In the simulator shown in FIG. 6, an output circuit chip 61 in a transmitter which contains an input means 2, a drive means 3 including two stages of inverters, a buffer means 5 for making the output signal waveform output from the drive means 3 dull, and an output means 4 is linked to a package 63 (impedance=50.4, delay=355.5 psec), and then connected to a receiving means 62 having appropriate circuitry and via a package 65 (impedance=50.4, delay=355.5 psec) and a coaxial cable 64 (impedance=50, delay=approx. 11 nsec).

When the simulator having the foregoing circuitry was used to dull the transitions of gate signals relative to that of an input signal, it was determined how an output signal changes.

Satisfactory conditions for simulation were that temperature was −40° C. and a supply voltage was 3.6 V, and unsatisfactory conditions were that temperature was 125° C. and a supply voltage was 3.0 V.

The results of simulation are shown in FIGS. 7A to 12C.

FIGS. 7A to 10C show waveforms of signals provided when the foregoing simulator is used to input a low-frequency input signal. FIGS. 7A to 7C show falls of outputs under the best conditions for simulation. FIGS. 8A to 8C show rises of outputs under the best conditions. FIGS. 9A to 9C show falls of outputs under the worst conditions for simulation. FIGS. 10A to 10C show rises of outputs under the worst conditions.

FIGS. 11A and 12C show waveforms of signals provided when a high-frequency input signal of 120 MHz is fed to the simulator.

FIG. 7A shows an output signal S1 at an output terminal INV2-OUT of the drive means 3 and an output signal S2 at an output terminal OBI-OUT of the buffer means 5 which are developed at the high-to-low transition of the input signal. FIG. 7B shows a signal S3 on a transmission line (PINO) between the package 63 and coaxial cable 64 in FIG. 6. FIG. 7C shows a signal S4 on a transmission line (PAD1) between the package 65 and receiving means 62 in a receiver.

As is apparent from FIGS. 7A to 7C, the output signal S2 supplied from the buffer 5 lags behind the output signal S1 of the drive means 3 by a given time interval. The signal S3 on the line PINO leading to the coaxial cable 64 has undesired changes F1 caused by noise, overshooting, or ringing.

The undesired changes F1 are propagated to result in amplified changes F2 in the signal S4 in the input stage of the receiver.

The undesired changes F2 occur because reflection is induced by an impedance mismatch in the receiver or ringing in the package 65, the reflection are manifested as undesired changes F3 of the signal S3, which result in undesired changes F4 of the signal S4, then cause undesired changes F5 to arise in the signal S3.

FIGS. 8A to 8C show waveforms of signals which are provided by the same simulator as the one providing the signals shown in FIGS. 7A to 7C at the low-to-high transition of an input signal.

As is apparent from FIGS. 8A to 8C, even when the input signal makes a low-to-high transition, similar to FIGS. 7A to 7C, influence of noise or reflections appears.

FIGS. 9A to 9C and FIGS. 10A to 10C show the waveforms of signals provided when an input signal makes a low-to-high transition and a high-to-low transition respectively. Herein, the conditions for simulation are relatively unsatisfactory; that is, a time lag between the output signals S1 and S2 is made longer than the one adopted in the aforesaid simulation.

FIGS. 11A to 12C show waveforms of signals provided by performing the same simulation using the aforesaid simulator in which the aforesaid output circuit is employed and a high-frequency signal of 120 MHz is supplied as an input signal.

FIGS. 11A to 11C show waveforms of signals provided when a time lag between the output signals S1 and S2 is small. FIGS. 12A to 12C show waveforms of signals provided when the time lag between the output signals S1 and S2 is large.

As is apparent from FIGS. 11A to 12C, when a high-frequency signal is being handled, undesired changes F1 to F5 occur in the signals S3 and S4. The undesired changes F1 to F5 are amplified gradually.

As is apparent from the results of the aforesaid simulation, according to the prior art, when a time lag is made longer in order to dull the transition of a control signal fed to an output means, the influence of noise or reflections occurring in an output signal cannot be eliminated.

SUMMARY OF THE INVENTION

An object of the present invention is to resolve the underlying drawbacks in the prior art and to provide an output circuit for a semiconductor circuit capable of prolonging the rise time or fall time of an output signal without degrading the circuit's operating frequency and thus preventing the occurrence of malfunctions resulting from undesired changes in an output signal due to ringing, noise, or reflections occurring at the transition of the output signal.

In order to achieve the foregoing object, the present invention adopts the circuitry described below. Specifically, a semiconductor circuit has an output circuit comprising an input means, an output means including a transistor, and a control signal control means that is disposed between the input means and output means, outputs a control signal for use in driving the transistor in the output means responsively to the transition of a signal fed to the input means, and changes the control signal according to a function of time.

A semiconductor circuit in accordance with the present invention has an output circuit having the foregoing elements. The transition of an internal signal S2 is dulled during a time interval from when the gate signal of an output means, which is provided when the output circuit is in operation, approaches a threshold voltage of an output transistor until the output signal stops changing.

According to the present invention, as mentioned above, when an output signal supplied from an output transistor in an output means makes a substantial transition, the transition of an internal control signal S2 supplied from an output circuit is dulled. In any other time interval, the transition of the internal control signal S2 is fast. A drop in operating frequency is thus minimized and the occurrence of undesired changes in an output signal, due to noise or reflections is suppressed to the greatest extent.

BRIEF DESCRIPTION OF THE DRAWINGS

FIG. 2A shows a waveform of the control signal detected at the low-to-high transition of an input signal, while FIG. 2B shows a waveform of the control signal detected at the high-to-low transition of the input signal.

FIG. 5A shows a waveform of the control signal detected at the low-to-high transition of an input signal, while FIG. 5B shows a waveform of the control signal detected at the high-to-low transition of the input signal.

FIGS. 8A to 8C are graphs plotted to show waveforms of signals provided by the conventional output circuit and detected by performing a simulation.

FIGS. 10A to 10C are graphs plotted to show waveforms of signals provided by the conventional output circuit and detected by performing a simulation.

FIGS. 14A to 14C are graphs plotted to show waveforms of signals provided by the output circuit in accordance with the present invention and detected by performing a simulation.

FIGS. 15A to 15C are graphs plotted to show waveforms of signals provided by the output circuit in accordance with the present invention and detected by performing a simulation.

FIGS. 17A to 17C are graphs plotted to show waveforms of signals provided by the output circuit in accordance with the present invention and detected by performing a simulation.

FIGS. 18A to 18C are graphs plotted to show waveforms of signals provided by the output circuit in accordance with the present invention and detected by performing a simulation.

FIG. 21A is a graph showing curves plotted with values of the output signals that are measured at the low-to-high transition of an input signal. FIG. 21B is a graph showing curves plotted with values of the output signals that are measured at the high-to-low transition of the input signal.

DETAILED DESCRIPTION OF THE PREFERRED EMBODIMENT

An embodiment of a semiconductor circuit in accordance with the present invention will be described, in detail, with reference to the drawings.

Figure 1:
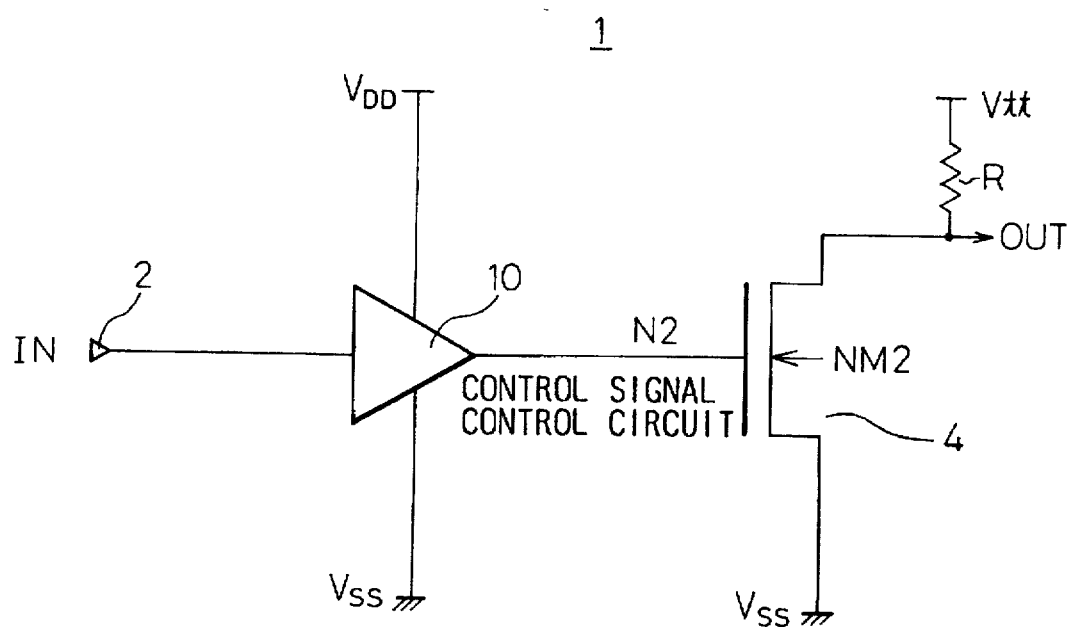
FIG. 1 is a block diagram showing the circuitry of an example of an output circuit in accordance with the present invention.

FIG. 1 is a block diagram showing an example of fundamental elements of an output circuit for a semiconductor circuit in accordance with the present invention. In FIG. 1, the output circuit comprises an input means 2, an output means 4 including a transistor NM2, and a control signal control means 10 that lies between the input means 2 and output means 4, outputs a control signal for use in driving the transistor in the output means 4 responsively to the transition of a signal fed to the input means 2, and changes the control signal according to a function of time.

In the control signal control means 10 in accordance with the present invention, an example of a facility for changing the control signal according to a function of time changes the control signal in response to the transition of a signal fed to the input means 2 so that the temporal coefficient of variation of the control signal will change with the passage of time. The control signal control means 10 may have any circuitry as long as it has the above capability.

The circuitry and operation of the control signal control means 10 in accordance with the present invention will be described. In the output circuit in FIG. 1, an input signal IN to the input means 2 is fed to the control signal control means 10 interposed between a high-voltage line $V_{DD}$ and a low-voltage line $V_{SS}$. The control signal control means 10 supplies a control signal N2.

The control signal N2 is fed to an n-channel transistor NM2 forming the output means 4 through a gate of the transistor NM2. As a result, an output signal OUT is supplied from an output terminal that is a junction between a source of the n-channel transistor NM2 and a resistor R linked to a terminal power line Vtt.

The control signal control means 10 in accordance with the present invention operates so that when an input signal IN makes a low ($V_{SS}$)-to-high ($V_{DD}$) transition, the output signal N2 will change at a large temporal coefficient of variation during a time interval A until it gets close to the threshold voltage Vth of the output transistor NM2; that is, during a time interval from a time instant t1 to a time instant t2.

During the time interval A, the output signal OUT of the output means 4 does change but remains at the Vtt value.

During a time interval B from the time instant t2 to a time instant t3, the control signal N2 for use in controlling the gate of the output transistor NM2 remains close to the threshold voltage Vth of the output transistor NM and changes at a low temporal transition rate.

During the time interval B, the output signal OUT of the output means 4 decreases gradually from the Vtt value and gets close to the voltage $V_{SS}$ at the time instant t3 at which the time interval B terminates.

During the time interval B, the output signal of the output transistor substantially changes.

Thereafter, during a time interval C from the time instant t3 to a time instant t4, the output signal of the output transistor NM2 has substantially finished changing, and the control signal N2 for use in controlling the gate of the output transistor NM2 changes at a high temporal coefficient of variation.

During the time interval C, the output signal of the output transistor becomes close to the voltage $V_{SS}$ and does not change.

Figure 2A:
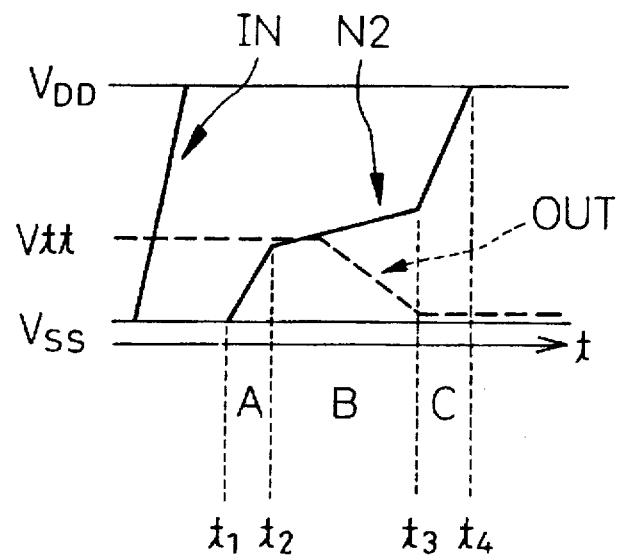
FIGS. 2A and 2B are explanatory diagrams concerning waveforms of a control signal in the output circuit in accordance with the present invention.
Figure 2B:
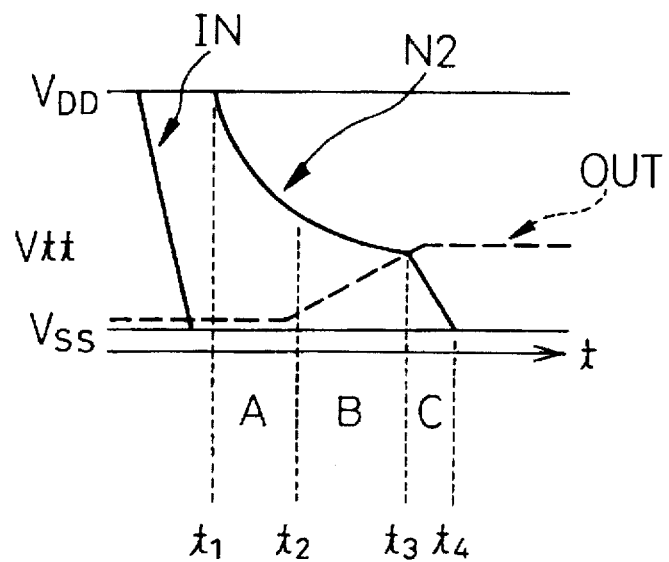

FIG. 2B shows waveforms of signals provided when the input signal IN makes a high ($V_{DD}$)-to-low ($V_{SS}$) transition. The control signal N2 of the control signal control means 10, that is, a gate signal control signal changes so as to change from a high temporal coefficient of variation to a low temporal coefficient of variation in the form of a curve.

During the time interval A, the output signal OUT of the output means 4 does not change but remains at the $V_{SS}$ value. During the time interval B succeeding the time instant t2, the output signal OUT of the output means 4 rises gradually. At the end of the time interval B; that is, at the time instant t3, the output signal OUT becomes substantially close to the voltage Vtt.

During the time interval B, the output signal of the output transistor substantially changes.

During the time interval C from the time instant t3 to t4, the output signal of the output transistor NM2 has substantially finished changing. The control signal N2 for use in controlling the gate of the output transistor NM2 changes at a high temporal coefficient of variation in control output signal wave.

During the time interval C, the output signal of the output transistor does not change but remains at a value substantially close to the Vtt value.

The control signal control means 10 in accordance with the present invention responds to the transition of a signal fed to the input means 2 and provides a control signal N2, which changes at a lower temporal coefficient of variation in the control signal wave, during a time interval B (second time interval) from when the control signal N2 reaches the threshold voltage Vth of the transistor NM2 until the output signal of the output transistor NM2 stops changing than during a preceding time interval A (first time interval) or a succeeding time interval C (third time interval).

Next, an example of the circuitry of an example of the control signal control means 10 having the foregoing capability in accordance with the present invention will be described.

Figure 3:
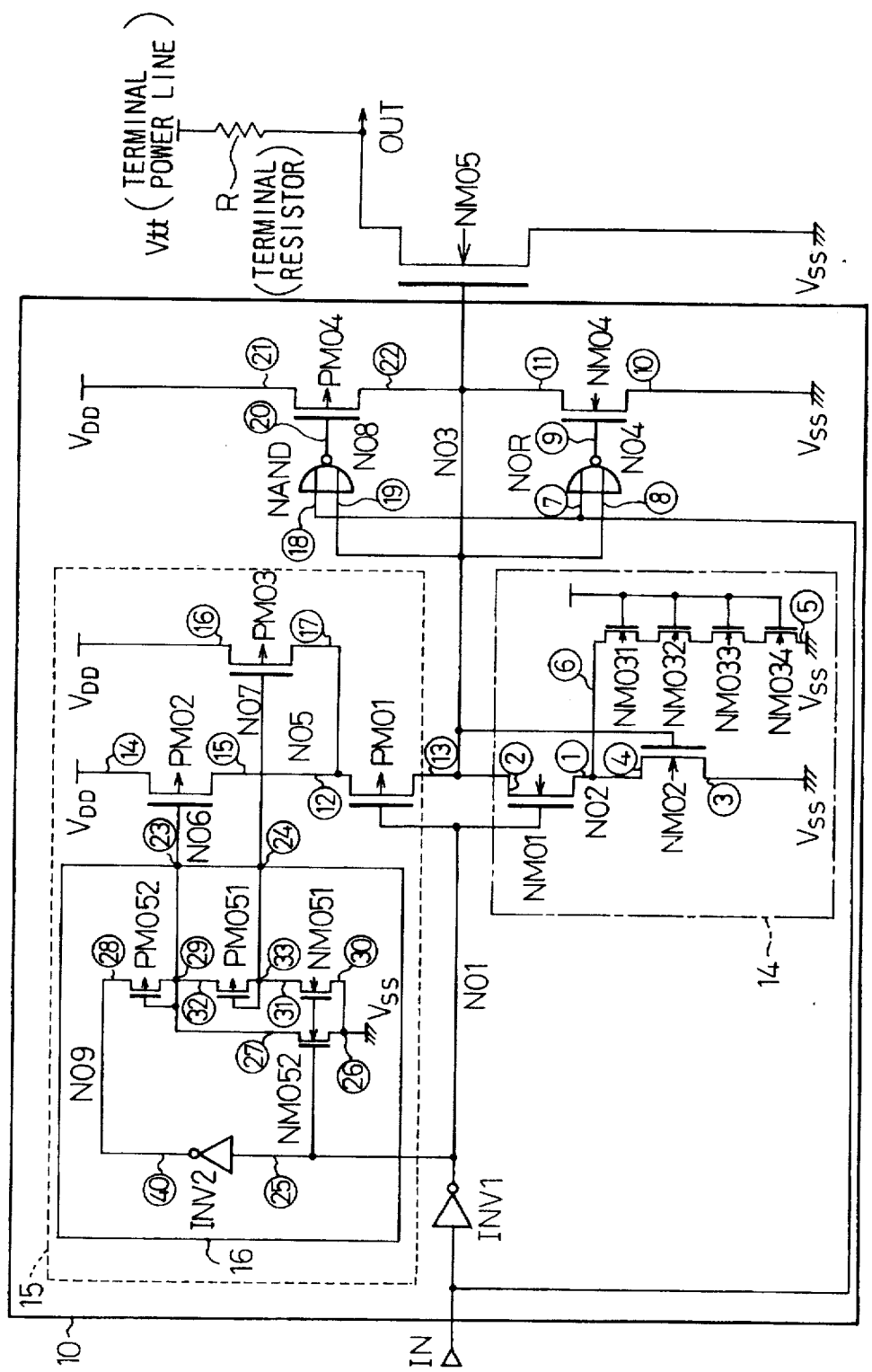
FIG. 3 is a block diagram showing circuit elements of an example of a control signal control means employed in the output circuit in accordance with the present invention.

FIG. 3 is a block diagram showing circuit elements of an example of the control signal control means 10 in accordance with the present invention. The control signal control means 10 includes a facility corresponding to the drive means 3 installed in a conventional output circuit, a first control circuit 14 that, when a signal is fed to the input means 2 makes a high-to-low transition and changes the temporal coefficient of variation of a control signal, and a second control circuit 15 that when the signal fed to the input means 4 makes a low-to-high transition, changes the temporal coefficient of variation of the control signal.

Particular elements of the first control circuit 14 in accordance with the present invention will be described below.

The first control circuit 14 in the control signal control means 10 in accordance with the present invention comprises a first inverter INV1 having an input terminal thereof connected to an input terminal IN of the control signal control means 10 and having an output terminal thereof connected to a first terminal NO1, a first n-channel transistor NMO1 having a gate thereof connected to the first terminal NO1, a first source of drain 1 thereof connected to a second terminal NO2, and a second source or drain 2 thereof connected to a third terminal NO3, a first n-channel transistor NMO2 having a gate thereof connected to the third terminal NO3, a first source or drain 3 thereof grounded, and a second source or drain 4 connected to the second terminal NO2, a third n-channel transistor NMO3 having a gate thereof connected to the high-voltage line $V_{DD}1$, a first source or drain 5 thereof grounded, and a second source or drain 6 thereof connected to the second terminal, a dual-input NOR gate circuit NOR having a first input terminal 7 thereof connected to the input terminal IN, a second input terminal 8 thereof connected to the third terminal NO3, and an output terminal 9 thereof connected to the fourth terminal NO4, and a fourth n-channel transistor NMO4 having a gate thereof connected to the fourth terminal NO4, a first source or drain 1 thereof grounded, and a second source or drain 11 thereof connected to the third terminal NO3.

The third n-channel transistor NMO3 in the first control circuit 14 in the control signal control means in accordance with the present invention may have a plurality of n-channel transistors NMO31 to NMO3n connected in series.

The temporal coefficient of variation of the control signal N2 can be lowered by connecting a plurality of transistors in series, and determined by changing the number of transistors connected.

Particular elements of the second control circuit 15 in accordance with the present invention will be described below.

The second control circuit 15 in the control signal control means 10 in accordance with the present invention comprises a first p-channel transistor PMO1 having a gate thereof connected to a first terminal NO1, a first source or drain 12 thereof connected to a fifth terminal NO5, and a second source or drain 13 thereof connected to the third terminal NO3, a second p-channel transistor PMO2 having a gate thereof connected to a sixth terminal NO6, a first source or drain 14 thereof connected to a high-voltage line $V_{DD}2$, and a second source or drain 15 thereof connected to a fifth terminal NO5, a third p-channel transistor PMO3 having a gate connected to the seventh terminal NO7, a first source or drain 16 thereof connected to a high-voltage line $V_{DD}3$, and a second source or drain 17 thereof connected to a fifth terminal NO5, a dual-input NAND gate circuit NAND having a first input terminal 18 thereof connected to the input terminal IN, a second input terminal 19 thereof connected to the third terminal NO3, and an output terminal 20 thereof connected to an eighth terminal NO8, a fourth p-channel transistor PMO4 having a gate thereof connected to the eighth terminal NO8, a first source or drain 21 thereof connected to a high-voltage line $V_{DD}4$, and a second source or drain 22 thereof connected to the third terminal NO3, and an intermediate-voltage generator means 16 having an input terminal thereof connected to the first terminal NO1, a first output terminal 23 thereof connected to the sixth terminal NO6, and a second output terminal 24 thereof connected to the seventh terminal NO7, and having the output signal of the first output terminal 23 set to a value higher than the output signal of the second output terminal 24.

The intermediate-voltage generator means 16 in accordance with the present invention comprises an inverter INV2 having an input terminal 25 thereof connected to the first terminal NO1 and an output terminal 4 thereof connected to a ninth terminal NO9, a fifth n-channel transistor NMO52 having a gate thereof connected to the first terminal NO1, a first source or drain 26 thereof grounded, and a second source or drain 27 thereof connected to the sixth terminal NO6, a fifth p-channel transistor PMO52 having a gate thereof connected to the sixth terminal NO6, a first source or drain 28 thereof connected to the ninth terminal NO9, and a second source or drain 29 thereof connected to the sixth terminal NO6, a sixth n-channel transistor NMO51 having a gate thereof connected to the first terminal NO1, a first source or drain 3 thereof grounded, and a second source or drain 31 thereof connected to the seventh terminal NO7, and a sixth p-channel transistor PMO51 having a gate thereof connected to the seventh terminal NO7, a first source or drain 32 thereof connected to the sixth terminal NO6, and a second source or drain 33 thereof connected to the seventh terminal NO7.

The operation of the control signal control means 20 employed in a semiconductor circuit in accordance with the present invention will be described below. As shown in FIG. 2A, when the input signal IN fed to the input means 2 makes a low-to-high transition, the inverter INV1 causes the first terminal NO1 to change from a high-level state to a low-level state. During a time interval A, the first n-channel transistor NMO1 is turned off. This causes the output signal of the NOR gate circuit NOR at the output terminal NO4 to go low. The fourth n-channel transistor NMO4 is also turned off.

Initially, the third terminal NO3 is in the low-level state. The output signal of the NAND gate circuit NAND at the eighth terminal NO8 is therefore driven high and the p-channel transistor PMO4 is turned off.

Until the first terminal NO1 changes states, the n-channel transistors NMO51 and NMO52 are turned on. Since the ninth terminal NO9 is in the low-level state, the sixth terminal NO6 and seventh terminal NO7 remain at a voltage equivalent to the voltage $V_{SS}$.

When the first terminal NO1 enters the low-level state, the n-channel transistors NMO51 and NMO52 are turned off. This causes the ninth terminal NO9 to enter the high-level state. The voltages at the sixth terminal NO6 an seventh terminal NO7 are therefore stepped up.

At this time, the voltage drop between the p-channel transistors PMO51 and PMO52 used as diodes causes the voltages at the sixth terminal NO6 and seventh terminal NO7 to exceed the voltage, $V_{DD}$.

For realizing the foregoing actions, in the present invention, the sizes of the p-channel transistors PMO51 and PMO52 are adjusted so that the voltage at the sixth terminal NO6 will exceed the threshold voltage Vth1 of the p-channel transistor PMO2 and the voltage at the seventh terminal NO7 will become lower than the threshold voltage Vth2 of the p-channel transistor PMO3.

Owing to the aforesaid circuitry, in the present invention, the p-channel transistor PMO2 is turned off quickly, while the p-channel transistor PMO3 remains on.

If conditions for simulation or ambient conditions including temperature are satisfactory, the impedances of the p-channel transistors PMO2 and PMO3 increase. When the conditions are unsatisfactory, the impedances decrease. Therefore, even if the conditions such as a process condition or temperature are changed, the difference among the temporal coefficients of variation of the control signal N2 becomes small.

Shortly after the input signal makes a transition, the p-channel transistors PMO2 and PMO3 are on. The voltage at the third terminal therefore increases quickly.

During the time interval B, since during the preceding time interval, the control signal N2 has risen in a short period, the voltage at the sixth terminal NO6 has a larger value than the threshold voltage Vth2 of the p-channel transistor PMO2. The p-channel transistor PMO2 is therefore turned off and only the p-channel transistor PMO3 is on.

Consequently, the temporal coefficient of variation of the control signal IN2 at the third terminal NO3 becomes lower.

In the time interval C, the signal applied to the eighth terminal NO8 goes low after a time lag corresponding to a delay set in the NAND gate circuit NAND, and the p-channel transistor PMO4 is turned on. As a result, the p-channel transistor PMO4 causes the voltage at the third terminal NO3 to rise to the $V_{DD}$ value at a high rate. Consequently, the output signal OUT of the output means 4 falls from the Vtt value to the $V_{SS}$ value.

As shown in FIG. 2B, when the input signal IN fed to the input means 2 makes a high-to-low transition, the inverter INV1 causes the first terminal NO1 to change from the low-level state to high-level state. During the time interval A, the first p-channel transistor PMO1 is turned off. The eighth terminal NO8, that is an output terminal of the NAND gate circuit NAND, enters the high-level state. The p-channel transistor PMO4 is therefore turned off.

Initially, the third terminal NO3 is in the high-level state. The output signal of the NOR gate circuit NOR at the ninth terminal NO9 goes low. The n-channel transistor NMO4 is therefore turned off, and the n-channel transistor NMO2 is turned on.

Under the circumstances, the n-channel transistors NMO1 and NMO2 whose transistor sizes are large as well as the n-channel transistors NMO31 to NMO32 whose transistor sizes are small are on. The control signal applied to the third terminal NO3 falls at a high temporal coefficient of variation.

During the time interval B, as the voltage at the third terminal NO3 falls, the n-channel transistor NMO2 is gradually turned off. The n-channel transistors NMO1 and NMO31 to NMO34 are on. As a result, the voltage at the third terminal NO3 changes at a low temporal coefficient of variation.

During the time interval C, when the voltage at the third terminal NO3 falls lower than the threshold voltage Vth3 of the NOR gate circuit NOR, the input signal is driven low. The output signal goes high at the fourth terminal NO4, whereby the n-channel transistor NMO4 is turned on.

When the transistor NMO4 is turned on, the voltage at the third terminal NO3 falls to the $V_{SS}$ value at a high rate.

For different simulation conditions or ambient conditions including temperature, the threshold voltage Vth5 of the n-channel transistor NMO2 changes concurrently with the threshold voltage Vth4 of the n-channel transistor NMO4 in the final stage. This causes the voltage at the third terminal NO3 to change. As a result, a variation in the delay of the overall circuitry is diminished.

FIGS. 13A to 18C show the undesired changes in an output signal of a semiconductor circuit using the control signal control means 10 in accordance with the present invention, which are measured by performing simulation under the same conditions as those under which the results shown in FIGS. 7A to 12C are provided.

Figures 7A, 7B, 7C:
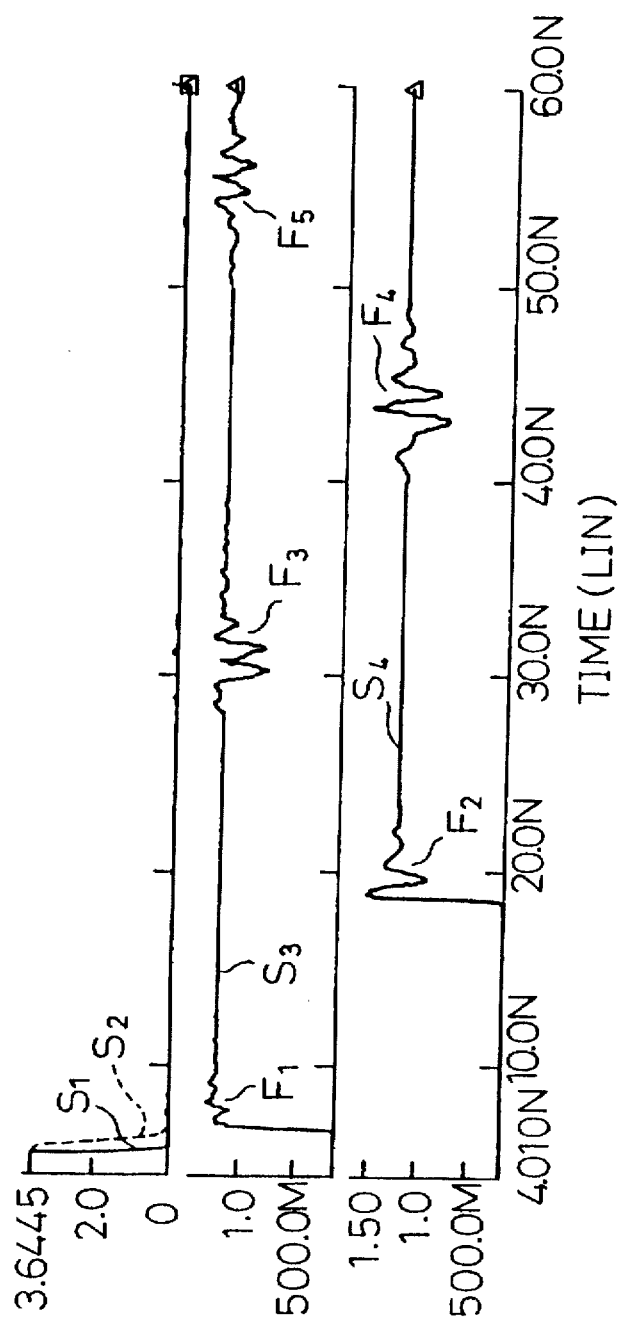
FIGS. 7A to 7C are graphs plotted to show waveforms of signals provided by the conventional output circuit and detected by performing a simulation.
Figures 13A, 13B, 13C:
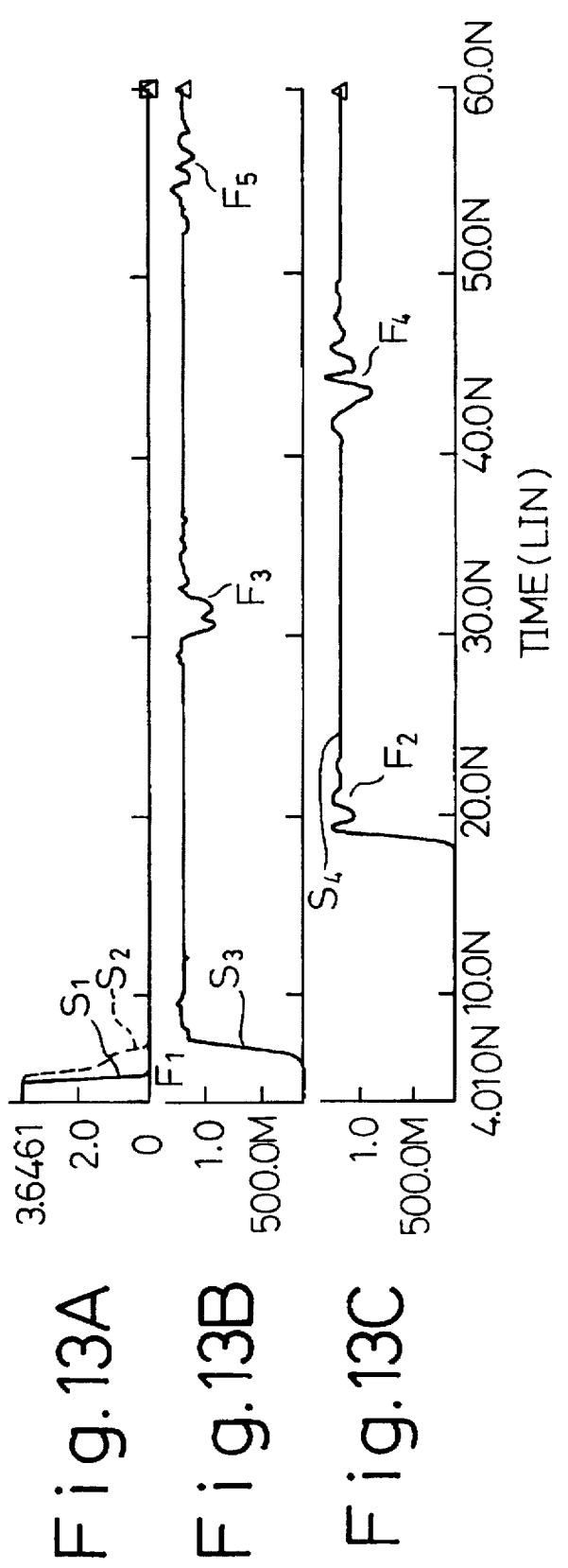
FIGS. 13A to 13C are graphs plotted to show waveforms of signals provided by the output circuit in accordance with the present invention and detected by performing a simulation.

FIGS. 13A to 13C are associated with the FIGS. 7A to 7C, showing the results of simulation. FIGS. 14A to 14C are associated with FIGS. 8A to 8C, showing the results of another simulation.

Figures 9A, 9B, 9C:
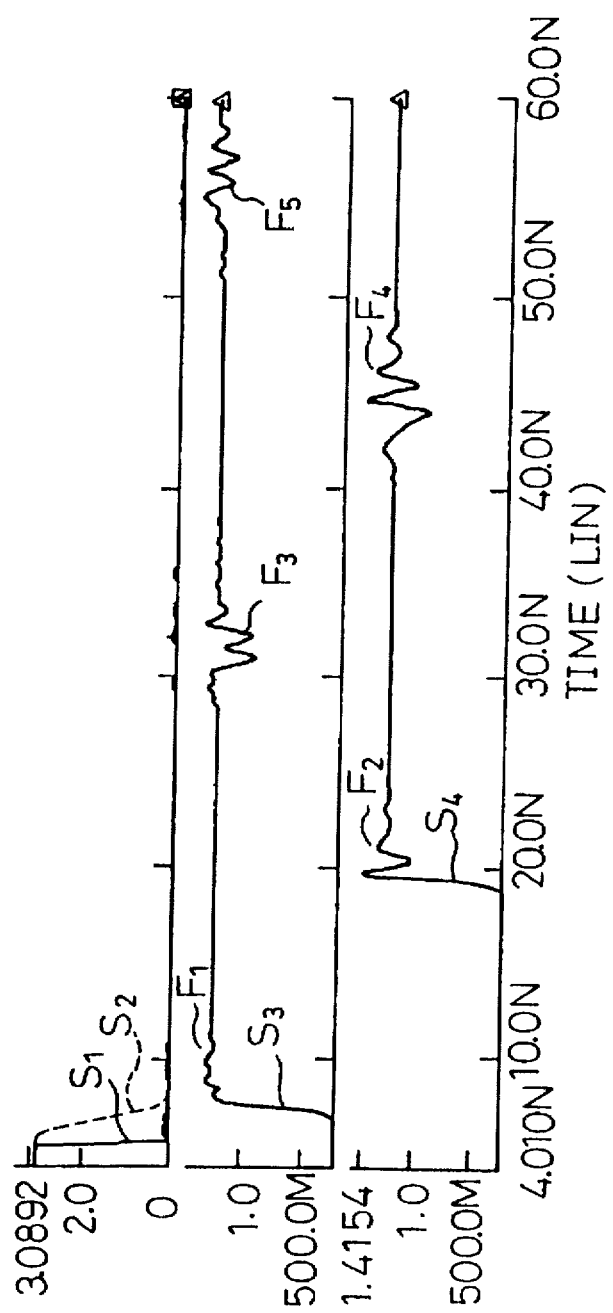
FIGS. 9A to 9C are graphs plotted to show waveforms of signals provided by the conventional output circuit and detected by performing a simulation.
Figures 16A, 16B, 16C:
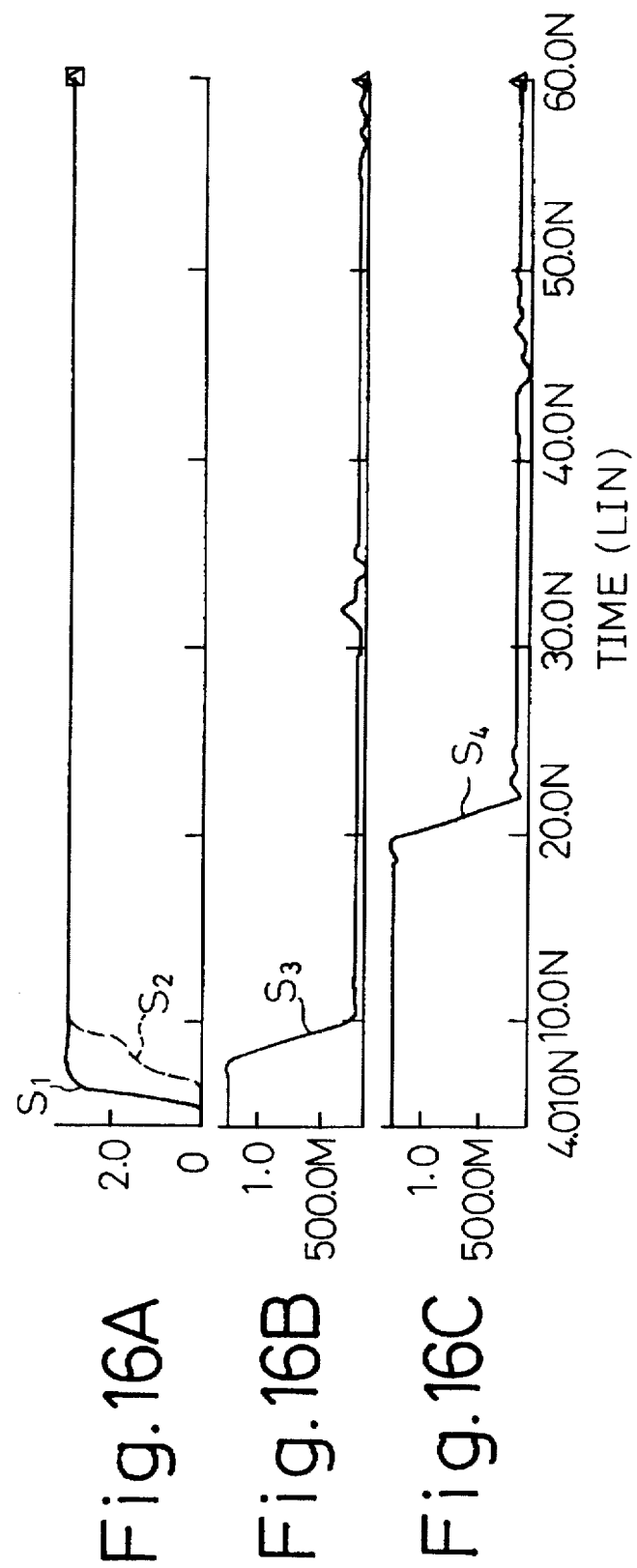
FIGS. 16A to 16C are graphs plotted to show waveforms of signals provided by the output circuit in accordance with the present invention and detected by performing a simulation.

FIGS. 15A to 15C are associated with FIGS. 9A to 9C, showing the results of simulation. FIGS. 16A to 16C are associated with FIGS. 10A to 10C, showing the results of another simulation.

Figures 11A, 11B, 11C:
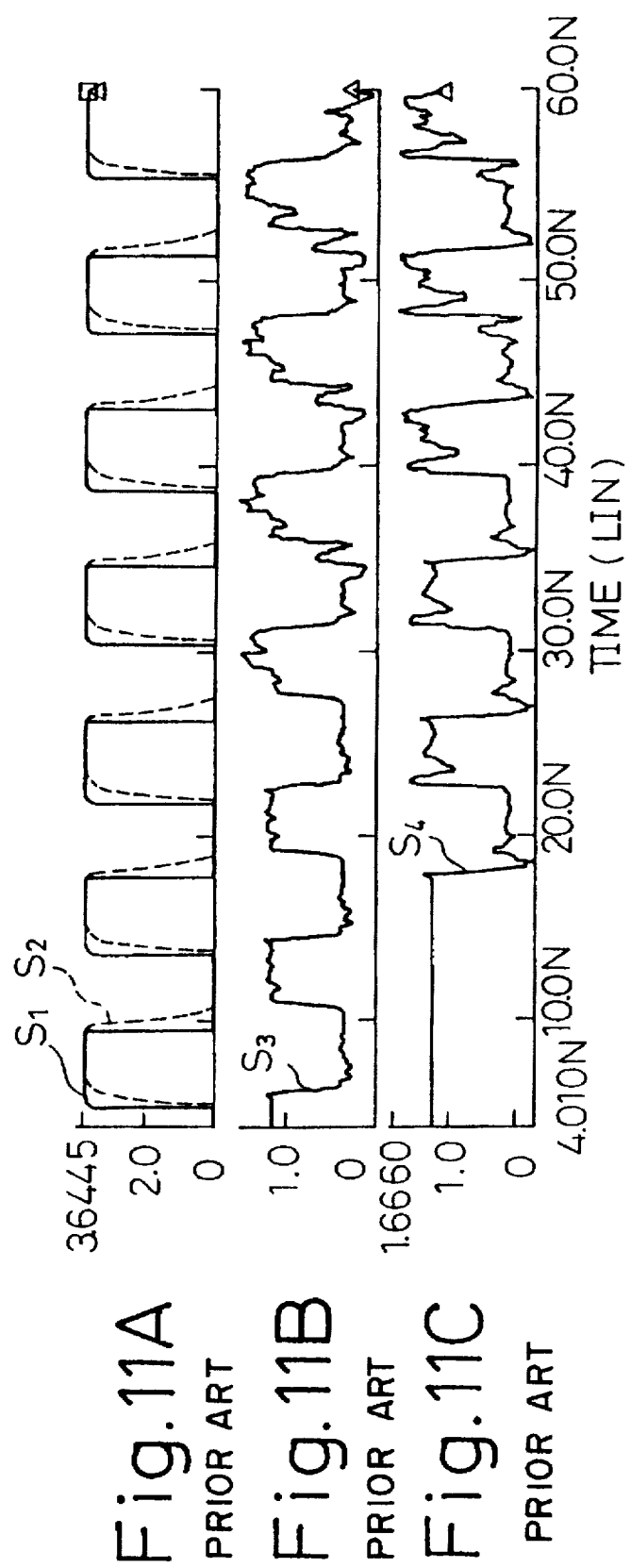
FIGS. 11A to 11C are graphs plotted to show waveforms of signals provided by the conventional output circuit and detected by performing a simulation.
Figures 12A, 12B, 12C:
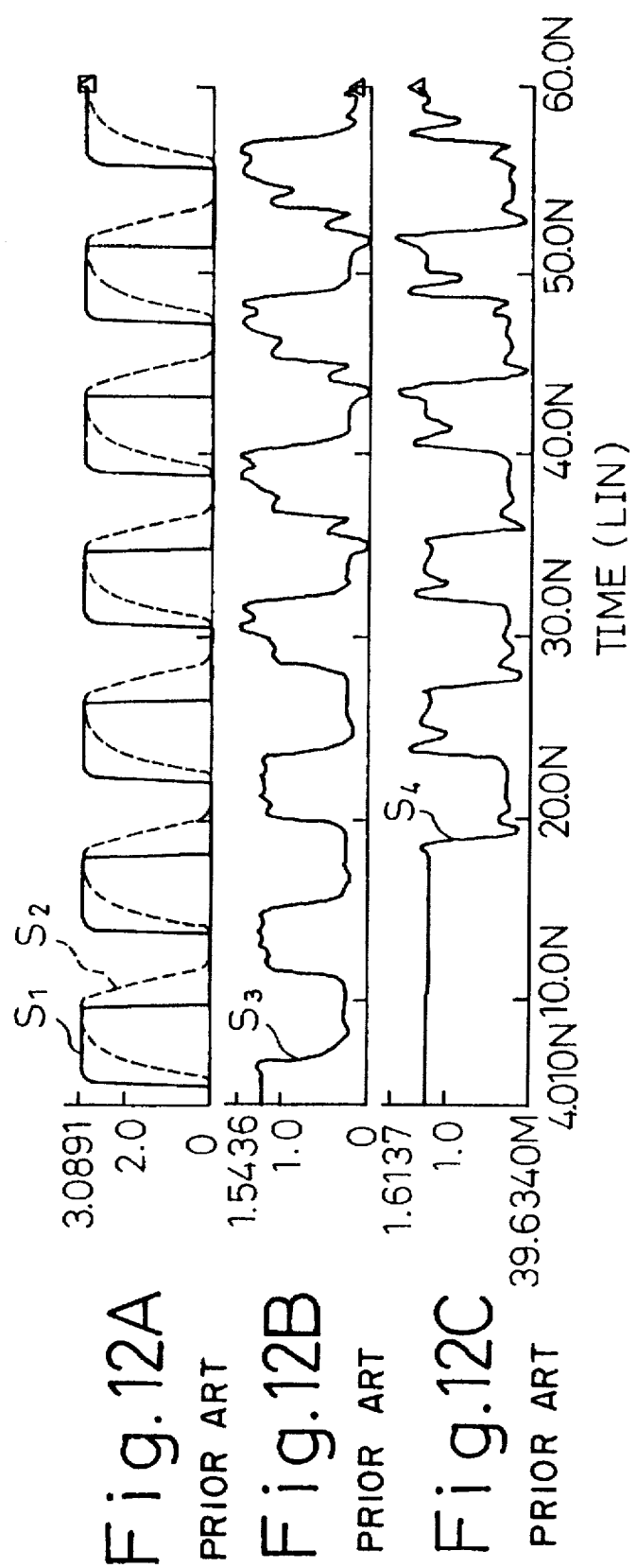
FIGS. 12A to 12C are graphs plotted to show waveforms of signals provided by the conventional output circuit and detected by performing a simulation.

FIGS. 17A to 17C are associated with FIGS. 11A to 11C, showing the results of simulation. FIGS. 18A to 18C are associated with FIGS. 10A to 10C, showing the results of another simulation.

As seen from FIGS. 13A to 18C, when an output circuit 1, including the control signal control means 10 in accordance with the present invention, is used, compared with those when a conventional output circuit is used, signal deteriorations due to ringing, noises, or reflection occurring at the transition of an output signal are drastically reduced. When a high-frequency signal is input, even if conditions are rather unsatisfactory, the signal deteriorations due to ringing, noises, or reflection occurring at the transition of an output signal are greatly reduced. The output circuit 1 operates normally.

Differences in operation between an output circuit including the control signal control means 10 in accordance with the present invention and a conventional output circuit will be described, through comparison, with reference to more practical circuitry.

Figure 4:
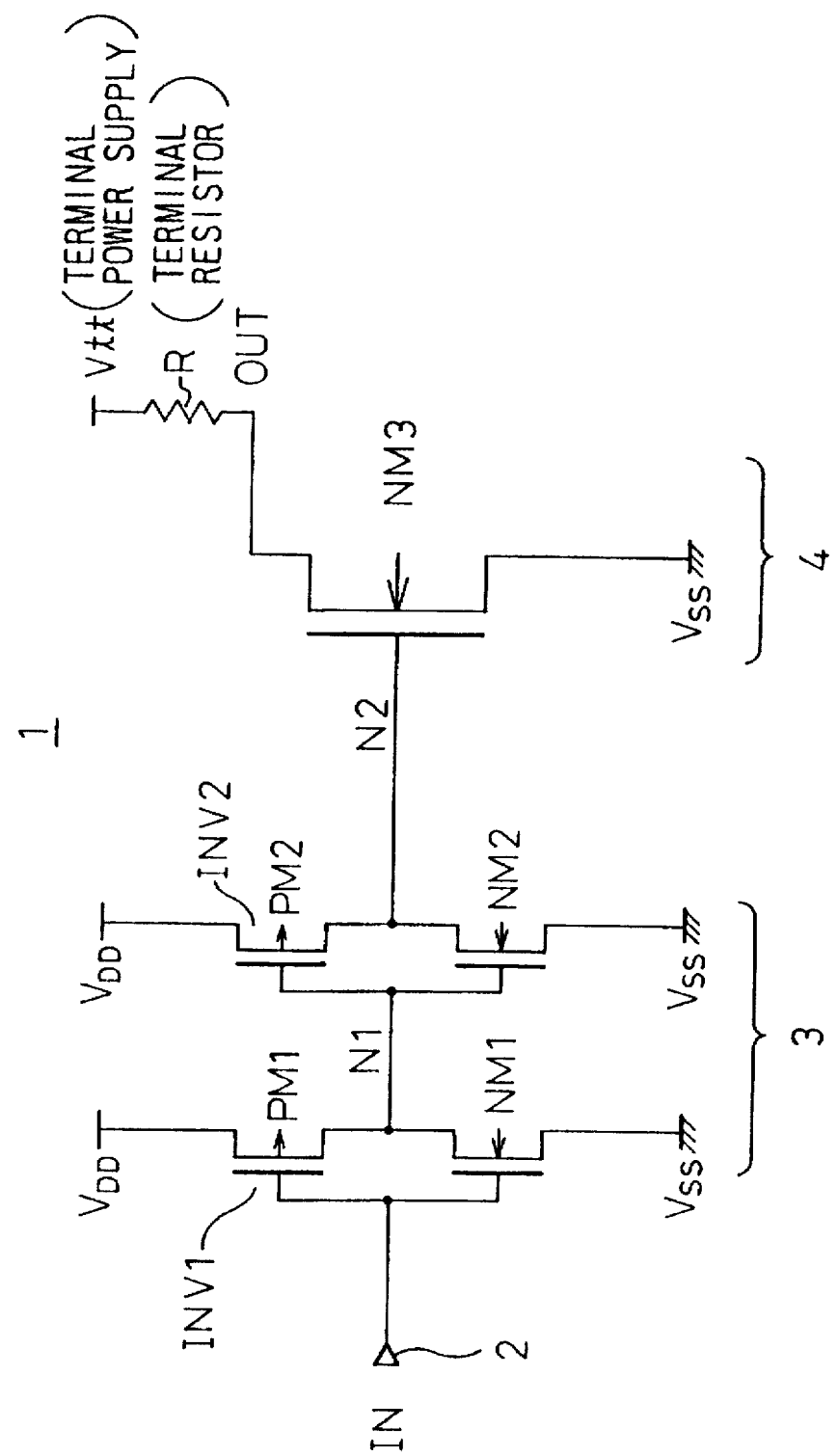
FIG. 4 is a block diagram showing an example of circuit elements of a conventional output circuit.
Figure 5A:
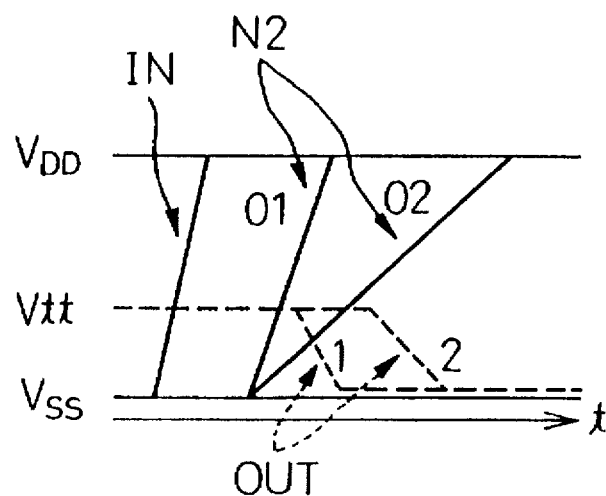
FIGS. 5A and 5B are explanatory diagrams showing waveforms of a control signal in the conventional output circuit.
Figure 5B:
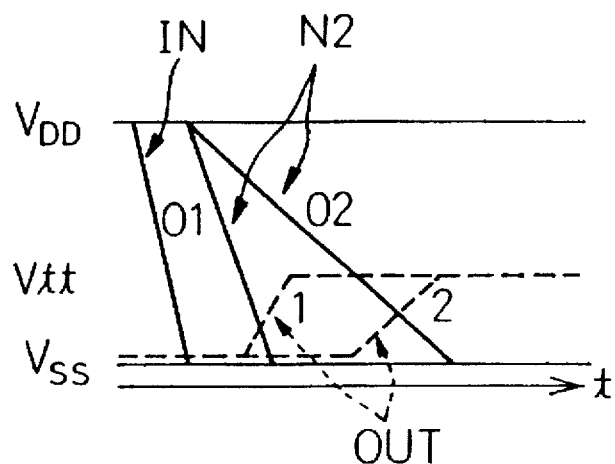
Figure 6:
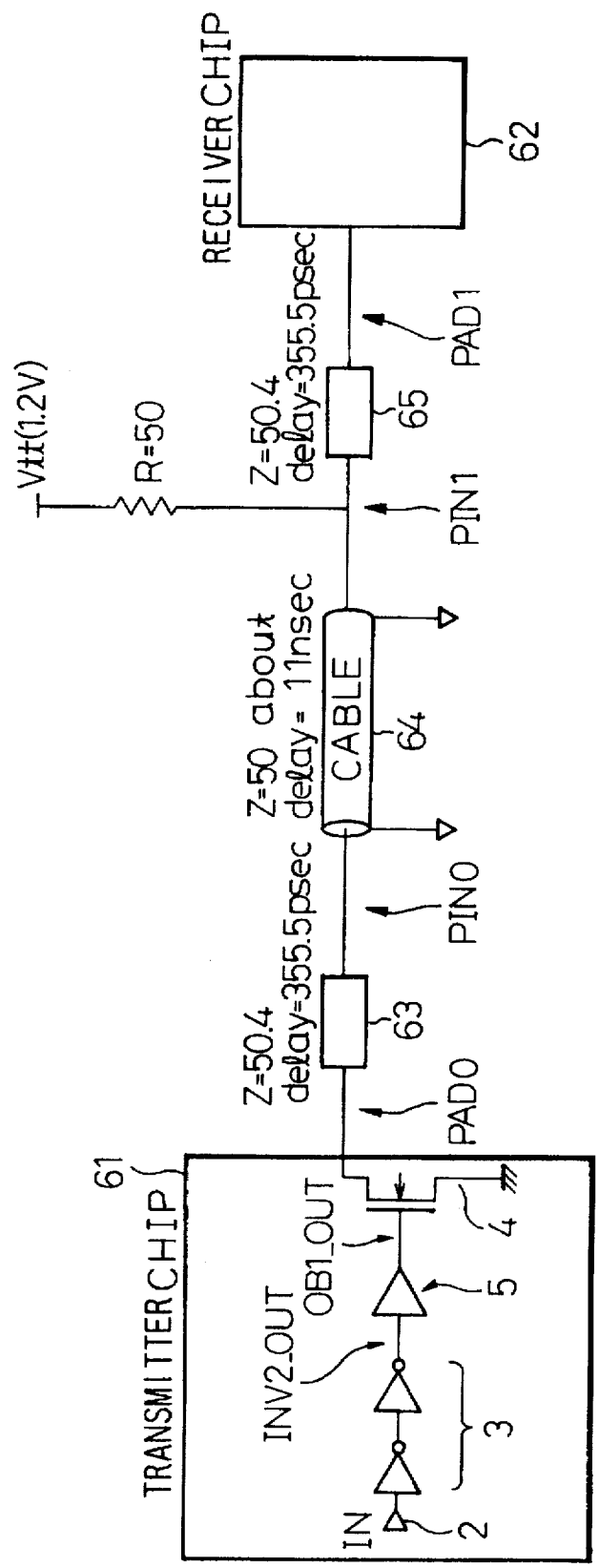
FIG. 6 is a block diagram showing the configuration of a simulator for use in verifying the properties of the output circuit in accordance with the present invention.
Figure 19:
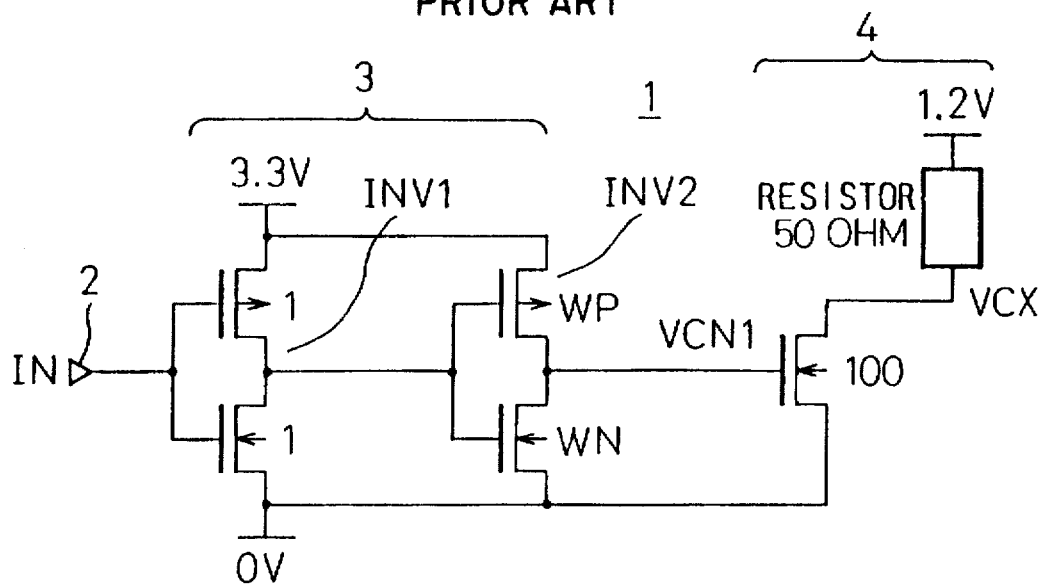
FIG. 19 is a block diagram showing an example of elements of the conventional output circuit employed in a comparative experiment.

FIG. 19 is a block diagram showing elements of an conventional open-drain type output circuit 1 used for an comparative experiment. In principle, the output circuit 1 has substantially the same elements as that in FIG. 4, including an input means 2, a drive means 3 composed of two stages of inverters INV1 and INV2 connected to a high-voltage source of 3.3 V, and an output means 4 including an n-channel transistor MOS FET 100. The n-channel transistor 100 has a source thereof connected to a 1.2-V power line via a resistor of 50 ohms.

For comparative examples, the p-channel transistor WP and n-channel transistor WN constituting the inverter INV2 are assigned different transistor sizes. Specifically, in a conventional example A, the size of the transistor WP is set to 1 and the size of the transistor WN is set to ⅓. In a conventional example B, the size of the transistor WP is set to 6 and the size of the transistor WN is set to 2.

Figure 20:
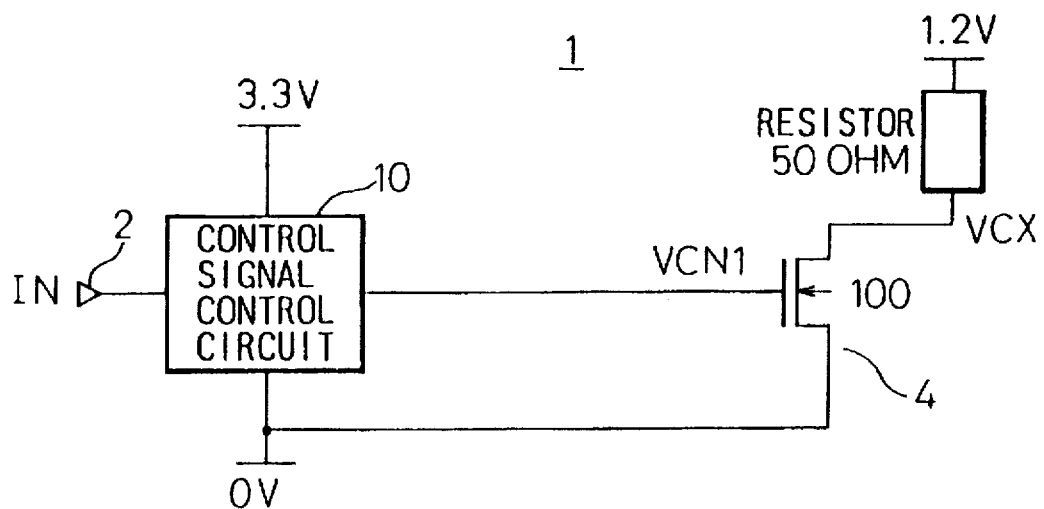
FIG. 20 is a block diagram showing an example of elements of the output circuit of the present invention employed in the comparative experiment.

FIG. 20 shows an example of the output circuit 1 including the control signal control means 10 in accordance with the present invention. The input means 2 and output means 4 have the same circuit elements as those in FIG. 19.

In FIGS. 19 and 20, VCN1 denotes a control signal applied to the gate of an n-channel transistor 100. VCN denotes an output signal of the output means 4.

Simulation was carried out to see how the signal supplied from the output means in the output circuit changes under the condition that the same input signal is fed to the foregoing two different comparative examples realized with a conventional output circuit and to the output circuit in accordance with the present invention.

In this comparative experiment, the properties of a measured signal are as listed below.

(1) A rise time and fall time of a gate signal of the n-channel transistor 100

(2) A time lag of an output signal relative to a gate signal of the n-channel transistor 100

(3) A transition rate of a gate signal of the n-channel transistor 100

Parameters in this comparative experiment are defined as listed below.

(a) Rise time (Tsup).

It is time required for a signal to change from a 5% value of a voltage between a high-voltage line and a ground to a 95% value thereof.

(b) Fall time (Tsdown).

It is time required for a signal to change from a 95% value of a voltage between a high-voltage source and a ground to a 5% value thereof.

(c) Maximum operating frequency (fmax).

It is a frequency determined from the fall time and the rise time.

Assuming that Tsmx=MAX(Tsup×Tsdown) is established, fmax=1/(2×Tsmax) is true.

(d) Time lag

For the rise time (Tup) of an output signal. It is the time elapsing until the output signal reaches 0.8 V after a gate signal of the open drain type n-channel transistor reaches the 95% value.

For the fall time (Tdown) of an output signal.

It is the time elapsing until the output signal reaches 0.8 V after the gate signal of the open drain type n-channel transistor reaches the 5% value.

(e) Transmission time (ΔV) of a gate signal.

It corresponds to a slope (dVg/dt) of a waveform of a gate signal of an open drain type n-channel transistor with respect to 1.3 V.

Figures 21A, 21B:
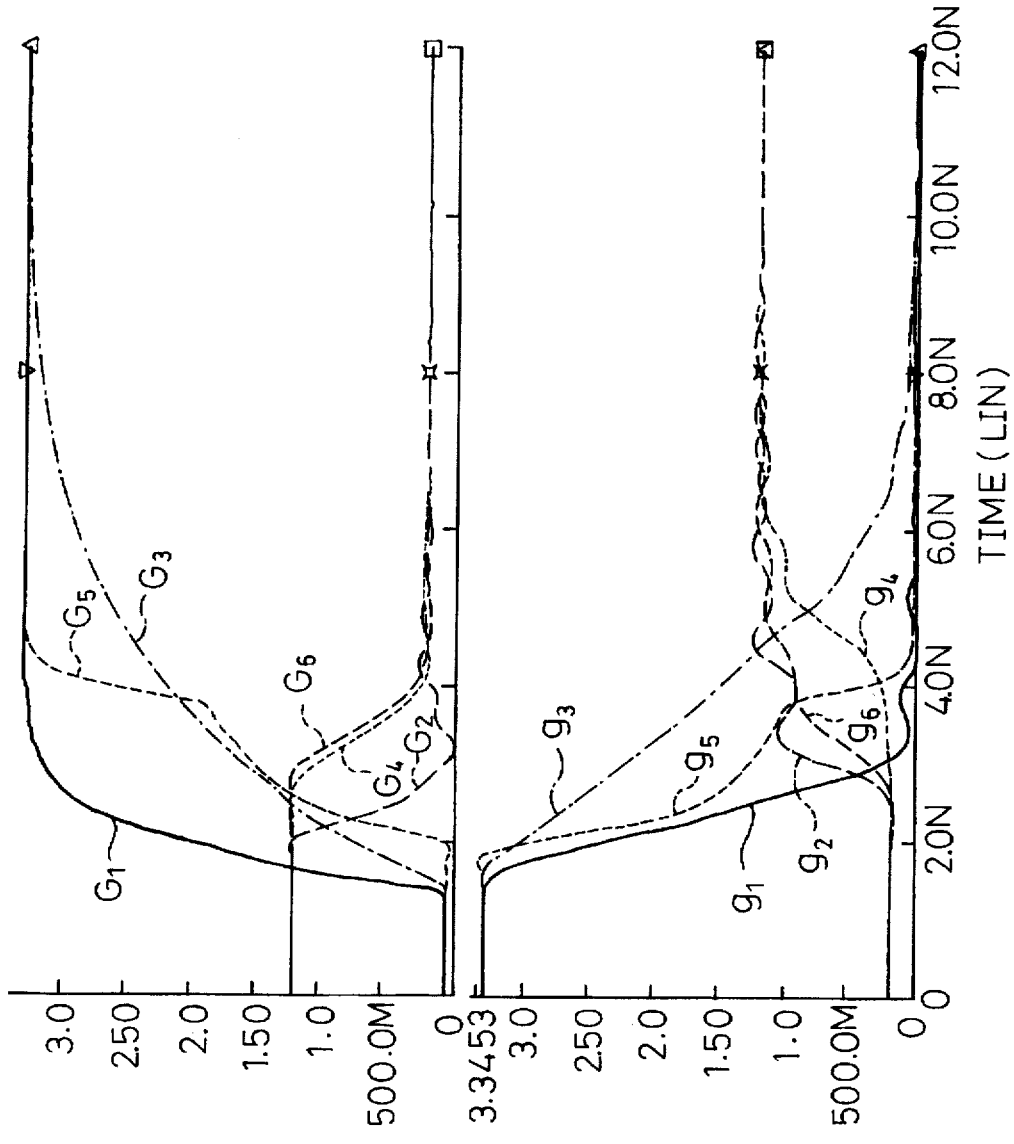
FIGS. 21A and 21B are graphs showing curves plotted with values of output signals provided by the output circuits which are measured in the comparative experiment.

As a result of simulation performed according to the foregoing procedure, measured values of a control signal VCN1 to be applied to the gate of the n-channel transistor 100 and of an output signal VCX of the output means 4 are plotted as shown in FIGS. 21A and 21B.

FIG. 21A shows a curve G1 indicating how the control signal VCN1 changes at the low-to-high transition of the input signal IN fed to the input means 2 in the conventional example A and a curve G2 indicating how the output signal VCX of the output means 4 changes thereat, and a curve G3 indicating how the control signal VCM1 changes at the low-to-high transition of the input signal IN fed to the input means 2 in the conventional example B and a curve G4 indicating how the output signal VCX of the output means 4 changes thereat.

Moreover, a curve G5 indicates how the control signal VCN1 changes in an output circuit including the control signal control means 10 in accordance with the present invention, and a curve G6 indicates how the output signal VCX of the output means 4 changes therein.

FIG. 21B shows a curve g1 indicating how the control signal VCN1 changes at the high-to-low transition of the input signal IN fed to the input means 2 in the conventional example A and a curve g2 indicating how the output signal VCX of the output means 4 changes thereat, and a curve g3 indicating how the control signal VCN1 changes at the high-to-low transition of the input signal IN fed to the input means 2 in the conventional example B and a curve g4 indicating how the output signal VCX of the output means 4 changes thereat.

Moreover, a curve g5 indicates how the control signal VCN1 changes in an output circuit including the control signal control means 10 in accordance with the present invention, and a curve g6 indicates how the output signal VCX of the output means 4 changes therein.

The values of the property parameters defined as mentioned above resulting from calculation based on the graphs of FIGS. 21A and 21B showing the results of the experiment are listed in Table 1.

TABLE 1

|  | Conventional example A | Conventional example B | Present invention |
|---|---|---|---|
| Tsup Tup | −1.55 nsec | 5.90 | 2.17 |
| ΔVup | 0.87 nsec | 1.66 | 1.25 |
|  | 3340E6 V/sec | 709E6 | 823E6 |
| Tsdown | 1.42 | 5.05 | 2.19 |
| Tdown | 1.44 | 3.04 | 1.64 |
| ΔVdown | −2080E6 | −595E6 | −494E6 |
| fmax | 322 MHz | 84 MHz | 228 MHz |

As seen from the above table, the transition of a gate signal is dulled in order to absorb reflection or noise (conventional example B), the rise time and fall time (Tsup and Tsdown) are prolonged. The maximum operating frequency becomes therefore lower.

The time lags of an output signal (Tup and Tdown) increase.

In the conventional example A, when the rise time and fall time (Tsup and Tsdown) of a gate signal are short, the maximum operating frequency is high. As seen from the graphs, the nose is high.

In the output circuit in accordance with the present invention, the transition rates of a gate signal that is close to a threshold voltage resemble those in the conventional example B. However, the rise time and fall time (Tsup and Tsdown) are shorter. The output circuit can therefore operate at a higher frequency.

Moreover, the time lags of the output signal are short.

An output circuit for a semiconductor circuit in accordance with the present invention has the aforesaid elements. With the transition of an input signal, the time required for an output signal to rise or fall can be made longer without degrading an operating frequency. Undesired changes or deteriorations in the output signal resulting from ringing, noise, or reflection occurring at the transition of the output signal can be prevented effectively.

What is claimed is:

1. A semicondutor circuit, comprising:

an input means;

an output means including a transistor; and a control signal control means disposed between said input means and output means, which outputs a control voltage for use in driving said transistor in said output means, wherein said control signal control means responds to transition of a signal fed to said input means and changes said control signal at a lower temporal coefficient of variation of said control signal during a time interval (second time interval), from when said control signal reaches a threshold voltage of said transistor in said output means until the output signal of said output transistor stops changing, than during a preceding time interval (first time interval) or a succeeding time interval (third time interval), and wherein said control signal control means includes a first control circuit that, when a signal fed to said input means makes a high-to-low transition, changes the temporal coefficient of variation of said control signal, and a second control circuit that, when said signal fed to said input means makes a low-to-high transition, changes said temporal coefficient of variation of said control signal, and wherein said first control circuit includes a first inverter having an input terminal thereof connected to an input terminal and an output terminal thereof connected to a first terminal, a first n-channel transistor having a gate thereof connected to said first terminal, a first source or drain thereof connected to a second terminal, and a second source or drain connected to a third terminal, a first n-channel transistor having a gate thereof connected to said third terminal, a first source or drain thereof being grounded, and a second source or drain thereof being connected to said second terminal, a third n-channel transistor having a gate thereof connected to a high-voltage line, a first source or drain thereof being grounded, and a second source or drain thereof being connected to said second terminal, a dual-input NOR gate circuit NOR having a first input terminal thereof connected to said input terminal, a second input terminal thereof being connected to said third terminal, and an output terminal thereof being connected to a fourth terminal, and a fourth n-channel transistor having a gate thereof connected to said fourth terminal, a first source or drain thereof being grounded, and a second source or drain thereof being connected to said third terminal.

2. A semiconductor circuit according to claim 1, wherein said third n-channel transistor has a plurality of n-channel transistors connected in series.

3. A semiconductor circuit comprising:

an input means;

an output means including a transistor; and a control signal control means disposed between said input means and output means, which outputs a control voltage for use in driving said transistor in said output means, wherein said control signal control means responds to a transition of a signal fed to said input means and changes said control signal at a lower temporal coefficient of variation of said control signal during a time interval (second time interval), from when said control signal reaches a threshold voltage of said transistor in said output means until the output signal of said output transistor stops changing, than during a preceding time interval (first time interval) or a succeeding time interval (third time interval), and wherein said control signal control means includes a first control circuit that, when a signal fed to said input means makes a high-to-low transition, changes the temporal coefficient of variation of said control signal, and a second control circuit that, when said signal fed to said input means makes a low-to-high transition, changes said temporal coefficient of variation of said control signal, and wherein said second control circuit includes a first p-channel transistor having a gate thereof connected to said first terminal, a first source or drain thereof being connected to a fifth terminal, and a second source or drain being connected to said third terminal, a second p-channel transistor having a gate thereof connected to a sixth terminal, a first source or drain thereof being connected to a high-voltage line $V_{DD}2$, and a second source or drain thereof being connected to said fifth terminal, a third p-channel transistor having a gate thereof connected to a seventh terminal, a first source or drain thereof being connected to a high-voltage line $V_{DD}3$, and a second source or drain thereof being connected to said fifth terminal, a dual-input NAND gate circuit NAND having a first input terminal thereof connected to said input terminal, a second input terminal thereof being connected to said third terminal , and an output terminal thereof being connected to an eighth terminal, a fourth p-channel transistor having a gate thereof connected to said eighth terminal, a first source or drain thereof being connected to a high-voltage line $V_{DD}4$, and a second source or drain thereof being connected to said third terminal, and an intermediate-voltage generator means 6 having an input terminal thereof connected to said first terminal, a first output terminal thereof being connected to said sixth terminal, and a second output terminal thereof being connected to said seventh terminal, and having a voltage at said first output terminal set to be higher than the one at said second output terminal.

4. A semiconductor circuit according to claim 3, wherein said intermediate-voltage generator means 6 includes an inverter having an input terminal thereof being connected to said first terminal and an output terminal thereof connected to a ninth terminal, a fifth n-channel transistor having a gate thereof being connected to said first terminal, a first source or drain thereof being grounded, and a second source or drain thereof being connected to said sixth terminal, a fifth p-channel transistor having a gate thereof connected to said sixth terminal, a first source or drain thereof being connected to said ninth terminal, and a second source or drain thereof being connected to said sixth terminal, a sixth n-channel transistor having a gate thereof connected to said first terminal, a first source of drain thereof being grounded, and a second source or drain thereof being connected to said seventh terminal, and a sixth p-channel transistor having a gate thereof connected to said seventh terminal, a first source or drain thereof being connected to said sixth terminal, and a second source or drain thereof being connected to said seventh terminal.

5. A semiconductor circuit, comprising:

an output transistor connected between an output node and a reference voltage;

an inverter connected between an input node and a gate of the output transistor; and a first variable resistor circuit connected between the reference voltage and a power node of the inverter;

a second variable resistor circuit connected between the gate of the output transistor and the reference voltage, and a resistance value thereof being set in such a way that the resistance value after completion of a change of the potential of the output node becomes a value smaller than the resistance value just before completion of the change; wherein a resistance value of the first variable resistor circuit is set in such a way that the resistance value, during a term from when a gate potential of the output transistor reaches to approximately the same value as a threshold value of the output transistor in response to the change of the potential of the input node until the change of the potential of the output node is completed, is set to a resistance value larger than the resistance value just before the term.

6. A semiconductor circuit, comprising:

an output transistor connected between an output node and a reference voltage;

an inverter connected between an input node and a gate of the output transistor; and a first variable resistor circuit connected between a power line and a power node of the inverter;

a second variable resistor circuit connected between the gate of the output transistor and the power line, and a resistance value thereof being set in such a way that the resistance value after completion of a change of the potential of the output node becomes a value smaller than the resistance value just before completion of the change;

wherein a resistance value of the first variable resistor circuit is set in such a way that the resistance value, during a term from when a gate potential of the output transistor reaches to approximately the same value as a threshold value of the output transistor in response to the change of the potential of the input node until the change of the potential of the output node is completed, is set to a resistance value larger than the resistance value just before the term.

* * * * *